United States Patent
Vera Villarroel et al.

(10) Patent No.: US 12,451,847 B2
(45) Date of Patent: Oct. 21, 2025

(54) BROADBAND ON-CHIP NESTED-LOOP ALTERNATING CURRENT (AC)-COUPLING SYSTEMS AND METHODS

(71) Applicant: Analog Devices, Inc., Wilmington, MA (US)

(72) Inventors: Ariel Leonardo Vera Villarroel, Lake Oswego, OR (US); Ronald F. Talaga, Jr., West Linn, OR (US); Abdelrahman Hesham Elsayed Ahmed, Vancouver (CA); Jianwei Wang, Portland, OR (US)

(73) Assignee: Analog Devices, Inc., Wilmington, MA (US)

( * ) Notice: Subject to any disclaimer, the term of this patent is extended or adjusted under 35 U.S.C. 154(b) by 301 days.

(21) Appl. No.: 17/987,985

(22) Filed: Nov. 16, 2022

(65) Prior Publication Data
US 2023/0170852 A1 Jun. 1, 2023

Related U.S. Application Data

(60) Provisional application No. 63/284,624, filed on Nov. 30, 2021.

(51) Int. Cl.
*H03F 1/42* (2006.01)
*H03F 1/18* (2006.01)
*H03F 3/217* (2006.01)
*H03F 3/45* (2006.01)

(52) U.S. Cl.
CPC ............. *H03F 1/42* (2013.01); *H03F 1/18* (2013.01); *H03F 3/2175* (2013.01); *H03F 2203/45101* (2013.01)

(58) Field of Classification Search
CPC . H03F 1/42; H03F 1/18; H03F 3/2175; H03F 2203/45101; H03F 3/195; H03F 3/45183; H03F 3/45941; H03F 3/45475; H03F 1/26
USPC .................................. 330/252–261
See application file for complete search history.

(56) References Cited

U.S. PATENT DOCUMENTS 6,771,945 B1 * 8/2004 Pickett ................. H03D 3/008
455/323

* cited by examiner

*Primary Examiner* — Hieu P Nguyen
(74) *Attorney, Agent, or Firm* — ArentFox Schiff LLP (57) ABSTRACT

Various embodiments of the invention provide for an AC-coupling method and systems that utilize a nested loop circuit to generate a differential mode output that facilitates an offset compensation and a common mode output that facilitates DC-biasing of an active circuit. In embodiments, the nested loop circuit comprises a differential amplifier and a differential mode loop that generates a differential mode output and a common mode loop that uses a common mode voltage and a reference voltage to generate the common mode output.

16 Claims, 8 Drawing Sheets

BROADBAND ON-CHIP NESTED-LOOP ALTERNATING CURRENT (AC)-COUPLING SYSTEMS AND METHODS

CROSS REFERENCE TO RELATED PATENT APPLICATIONS

The present application claims priority benefit, under 35 U.S.C. § 119(e), to co-pending and commonly-assigned U.S. Provisional Patent Application No. 63/284,624, filed on Nov. 30, 2021, entitled "BROADBAND ON-CHIP NESTED-LOOP ALTERNATING CURRENT (AC)-COUPLING SYSTEMS AND METHODS", and listing as inventors Ariel Leonardo Vera Villarroel, Ronald F. Talaga, Jr., Abdelrahman Hesham Elsayed Ahmed, and Jianwei Wang which application is herein incorporated by reference as to its entire content. Each reference mentioned in this patent document is incorporated by reference herein in its entirety.

BACKGROUND

A. Technical Field

The present disclosure relates generally to electrical broadband amplifier circuits. More particularly, the present disclosure relates to systems and methods for improving performance for broadband amplifier circuits in high-frequency applications such as electro-optical communications.

B. Background

In communications applications, a link such as an optical link typically contains several components that each has a specific functionality. At its inputs and outputs, each component facilitates interactions with preceding and/or subsequent components that it is coupled to. The particular performance of an electrical component depends on design choices, the technology employed in its fabrication, and other factors, such as power consumption. Because each component is optimized to work well within a set of given constrains, the component or subcomponent performs best under a specific set of operating conditions. However, these optimum operating conditions oftentimes differ from those of other components in the same (sub-)circuit. As an example, the optimum direct current (DC) operating point for a given electric component in a circuit may be greatly vary from the optimum DC operating point of an adjacent component in that circuit. Therefore, to achieve the best possible overall circuit performance, circuit designers generally aim at decoupling DC operating points at various points in an electrical link to allow each component or subcircuit to be independently optimized without affecting other components or parts of the design.

In practice, isolation of DC operating points is typically accomplished by adding relatively small-valued DC blocking capacitors at appropriate locations in the circuit to optimize operation and maintain signal integrity at the high frequency range. However, parasitic effects associated with of the DC blocking capacitors, in particular parasitic capacitance, negatively impacts high frequency operation. Conversely, the inherent size-limit of on-chip DC blocking capacitors and resulting limits on the amount of capacitance that can be utilized affects circuit operation at low frequencies, thereby, causing an unwanted degradation in the circuit's low frequency response.

Accordingly, it is desirable to have integrated systems and methods that allow system designers to optimize key design metrics in an electric circuit for maximum efficiency for a link, e.g., maximum operating frequency (i.e., the high frequency response) and lowest operating frequency (i.e., a low cut-off frequency), while maintaining high broadband circuit performance.

BRIEF DESCRIPTION OF THE DRAWINGS

References will be made to embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments. Items in the figures are not drawn to scale.

DETAILED DESCRIPTION OF EMBODIMENTS

In the following description, for purposes of explanation, specific details are set forth in order to provide an understanding of the invention. It will be apparent, however, to one skilled in the art that the invention can be practiced without these details. Furthermore, one skilled in the art will recognize that embodiments of the present invention, described below, may be implemented in a variety of ways, such as a process, an apparatus, a system, a device, or a method on a tangible computer-readable medium.

Components, or modules, shown in diagrams are illustrative of exemplary embodiments of the invention and are meant to avoid obscuring the invention. It shall also be understood that throughout this discussion that components may be described as separate functional units, which may comprise sub-units, but those skilled in the art will recognize that various components, or portions thereof, may be divided into separate components or may be integrated together, including integrated within a single system or component. It should be noted that functions or operations discussed herein may be implemented as components. Components may be implemented in software, hardware, or a combination thereof.

Furthermore, connections between components or systems within the figures are not intended to be limited to direct connections. Rather, data between these components may be modified, re-formatted, or otherwise changed by intermediary components. Also, additional or fewer connections may be used. It shall also be noted that the terms "coupled," "connected," or "communicatively coupled" shall be understood to include direct connections, indirect connections through one or more intermediary devices, and wireless connections.

Reference in the specification to "one embodiment," "preferred embodiment," "an embodiment," or "embodiments" means that a particular feature, structure, characteristic, or function described in connection with the embodiment is included in at least one embodiment of the invention and may be in more than one embodiment. Also, the appearances of the above-noted phrases in various places in the specification are not necessarily all referring to the same embodiment or embodiments.

The use of certain terms in various places in the specification is for illustration and should not be construed as limiting. A service, function, or resource is not limited to a single service, function, or resource; usage of these terms may refer to a grouping of related services, functions, or resources, which may be distributed or aggregated.

The terms "include," "including," "comprise," and "comprising" shall be understood to be open terms and any lists the follow are examples and not meant to be limited to the listed items. Any headings used herein are for organizational purposes only and shall not be used to limit the scope of the description or the claims. Each reference mentioned in this patent document is incorporate by reference herein in its entirety.

It is noted that embodiments described herein are given in the context of differential broadband high-frequency amplifiers, but one skilled in the art will recognize that the teachings of the present disclosure are not limited to the applications and may equally be used in other contexts.

In this document, the terms "capacitor circuit," "capacitor," and "DC blocking capacitor circuit" may be used interchangeably. Similarly, the terms "high impedance converter circuit," "converter circuit," "high impedance circuit," and "converter" may be used interchangeably; and the terms "nested loop circuit" and "nested loop biasing circuit" may be used interchangeably.

Various embodiments herein focus on implementations of a broadband circuit that comprises one or more of (1) a set of on-chip DC blocking capacitors that may be utilized to optimize a high frequency response, (2) high impedance circuitry that may be used to achieve an excellent low frequency response, and (3) a nested loop circuit that may be controlled in a manner such as to enable active circuitry, which may comprise both common and differential mode components to correct for offsets that may be present and provide DC bias to, ultimately, improve overall circuit performance in broadband applications.

Existing approaches that utilize, e.g., at inputs/outputs of links that contain several components that have different DC operating points, discrete off-chip DC blocking capacitors to improve high frequency performance, suffer from parasitic effects introduced by such capacitors. In such designs, DC blocking capacitors not only limit the maximum operating frequency of a circuit, but they add complexity to circuit design that, as a result, invariably increases manufacturing cost.

Some existing approaches that attempt to ameliorate this by integrating DC-blocking capacitors on-chip face problems caused by the fact that, due to area and material restrictions, the capacitance of on-chip DC-blocking capacitors has to be orders of magnitude smaller than those of off-chip capacitors. However, smaller capacitance values lead to an unwanted increase in the low cut-off frequency. Furthermore, when on-chip capacitors are used, biasing of on-chip components cannot be performed using the same techniques as when using off-chip DC blocking capacitors without also significantly affecting the low or high frequency response.

Therefore, it is highly desirable to have solutions that facilitate good low frequency operation for applications that utilize integrated DC-blocking capacitors and that provide a sufficiently low cut-off frequency such as to not degrade the circuit's broadband frequency response. It is further desirable to have fully integrated and technology-independent solutions, e.g., solutions that may be applied in a bipolar and/or complementary metal oxide semiconductor (CMOS) technologies that exhibit relatively low sensitivity to process, voltage, temperature variations, and other environmental conditions.

Figure 1:
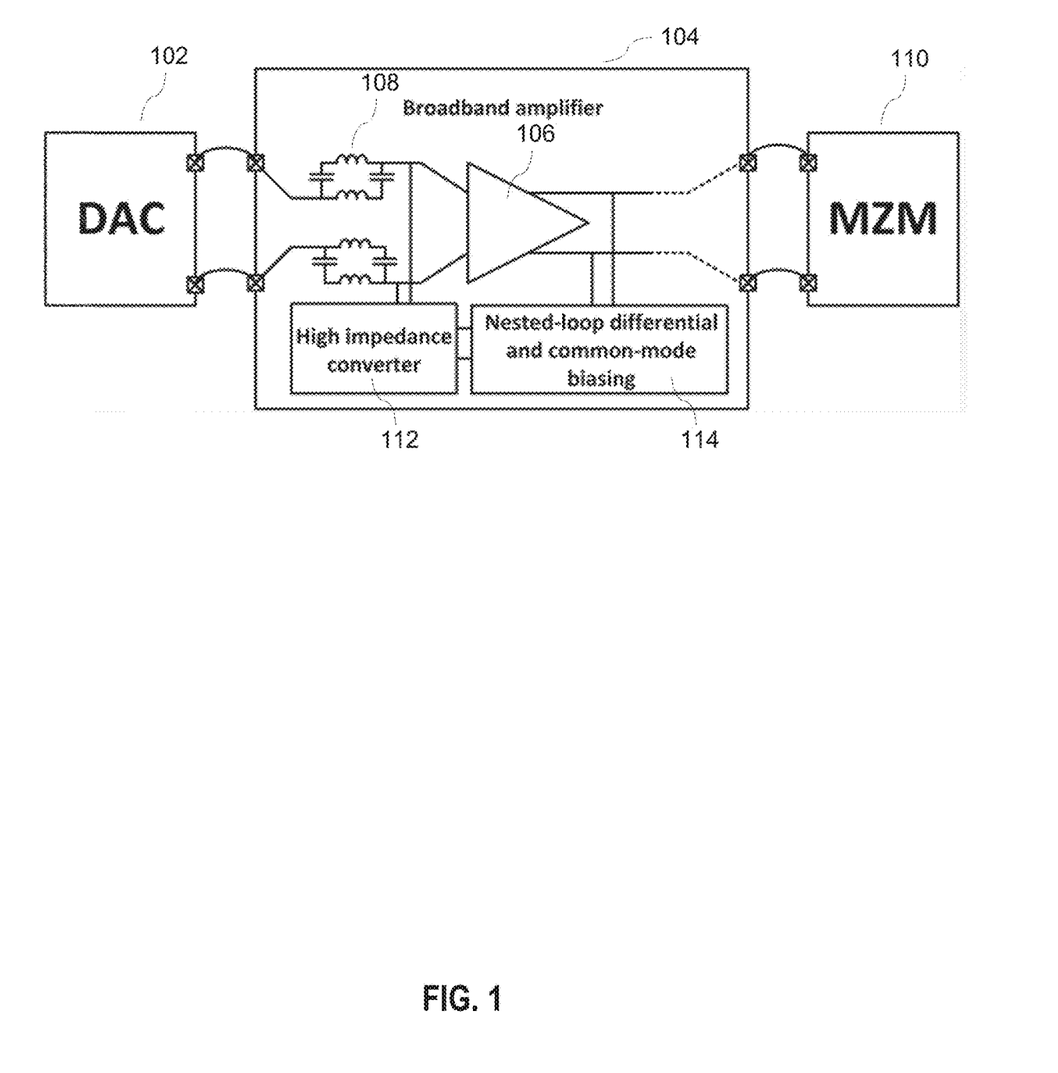
FIG. 1 is a simplified circuit diagram of an exemplary system implementation in a broadband optical communications link, according to various embodiments of the present disclosure.

FIG. 1 illustrates an exemplary system implementation in a broadband optical communications link, according to various embodiments of the present disclosure. In embodiments, communications link 100, which may be implemented, e.g., in an optical link driver, comprises digital-to-analog converter (DAC) 102 coupled to broadband amplifier circuit 104 that may be implemented on a chip. Amplifier circuit 104 is coupled to Mach-Zehnder modulator 110 and comprises amplifier 106, DC blocking capacitor circuit 108 that may also be integrated on-chip, high impedance converter circuit 112, and nested loop circuit 114.

As depicted in FIG. 1, the output of DAC 102 drives broadband amplifier circuit 104 that uses amplifier 106, which may be characterized by the amount of gain for a given frequency range, to output a voltage that drives Mach-Zehnder optical modulator 110. In embodiments, DC blocking capacitor circuit 108, high impedance converter circuit 112, and nested loop circuit 114 in broadband amplifier circuit 104 advantageously accommodate varying product requirements and/or a particular technology.

As discussed in greater detail below, on-chip distributed capacitor 108 may be implemented as distributed capacitance to minimize undesirable parasitic effect, such as parasitic capacitance, thus, enabling a higher frequency response. High impedance converter circuit 112 may advantageously be used to increase the input impedance of amplifier 106 such as to define, together with DC blocking capacitor 108, the low frequency cut-off (LFC) $f_{LF}C=1/(2*\pi*R*C)$, where C represents the total capacitance of DC-blocking capacitor 108, and R represents the impedance as defined by high impedance converter 112.

In embodiments, nested loop circuit 114 may be used to define suitable differential and common mode biasing in amplifier circuit 104. In certain applications, it is desirable to be able to adjust the gain of broad band amplifier 106 at high frequencies, ideally, without sacrificing gain at lower frequencies, or any other desirable properties.

Figure 2:
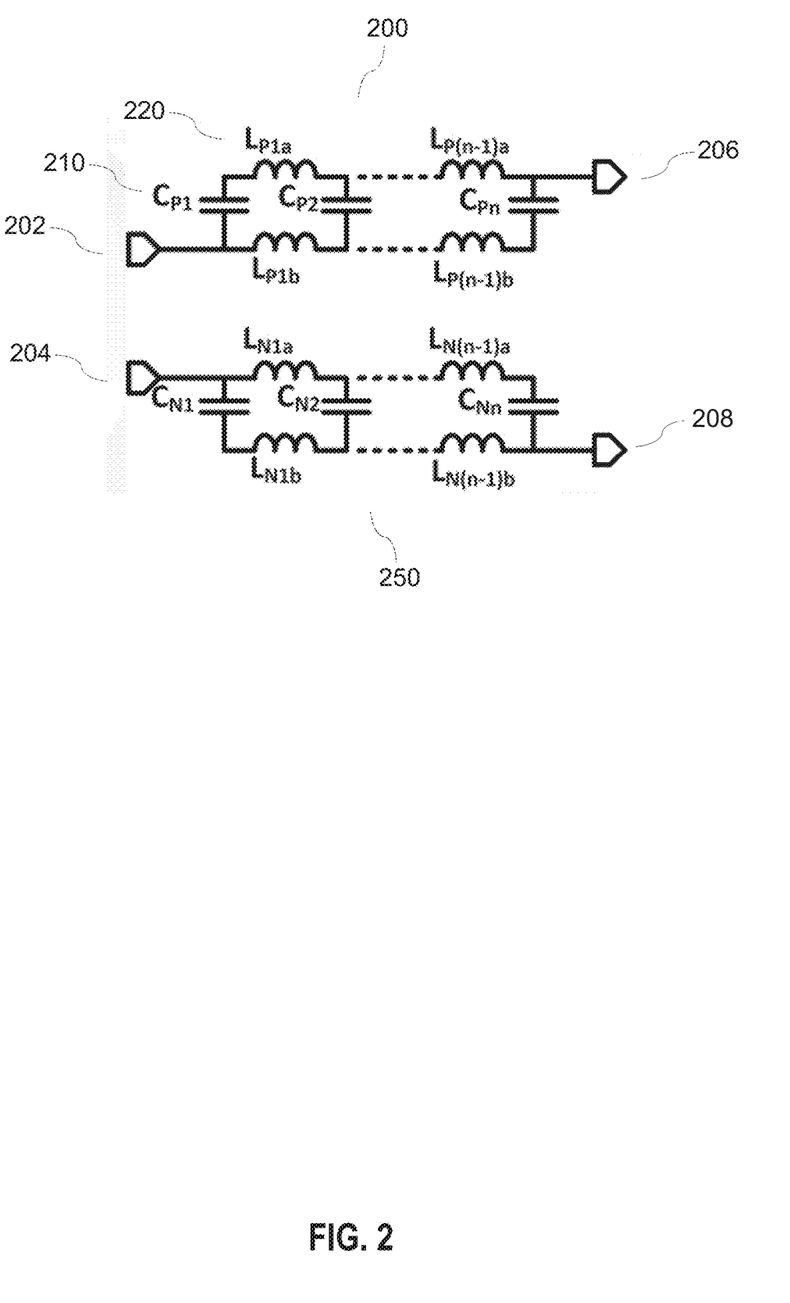
FIG. 2 is a simplified diagram depicting distributed on-chip DC blocking capacitor circuits, according to various embodiments of the present disclosure.

FIG. 2 is a simplified diagram depicting distributed on-chip DC blocking capacitor circuits, according to various embodiments of the present disclosure. Capacitor circuits 200, 250 have inputs 202, 204 and outputs 206, 208, which, as discussed in greater detail with reference to FIG. 6, may be used to couple to the inputs of a differential amplifier. As depicted, capacitor circuits 200, 250 comprise respective capacitive elements (e.g., 210), denoted as $C_{P1}$-$C_{Pn}$ and $C_{N1}$-$C_{Nn}$ in FIG. 2, and inductive elements (e.g., 220) denoted as $L_{P1a}$-$L_{P(n-1)a}$, $L_{P1b}$-$L_{P(n-1)b}$ and $L_{N1a}$-$L_{N(n-1)a}$, $L_{N1b}$-$L_{N(n-1)b}$. In each circuit (e.g., 200) a number of capacitors may be coupled in a parallel circuit configuration, such that the total capacitance of each of capacitor circuits 200, 250 may be defined mainly by the sum of the capacitance values (e.g., in the pF range) of the capacitors in each circuit 200, 250.

In embodiments, inductors in FIG. 2 may be implemented as discrete or distributed components, depending on application and frequency range. For example, at the low GHz frequency range, any number of inductors may be disposed in close physical proximity to each other on upper metal layers of a PCB, e.g., to reduce stray capacitance and maintain high performance. In embodiments, the inductance of the interconnections between capacitors may be exploited to implement suitable inductance values. Alternatively, discrete inductive components, each having a certain value (e.g., in the pH range) that is determined by its geometry, may be disposed between discrete capacitors.

It is understood that capacitance and inductance values may be chosen in a way such that unwanted resonances created by circuits 200, 250 will be shifted to a relatively high frequency range (e.g., tens or hundreds of GHz) that is beyond the frequency range of interest for a desired application. Overall, by using distributes capacitances, advantageously, the effect of parasitic capacitance to the substrate may be reduced, and a higher frequency response may be achieved compared with a single lump capacitor design of equivalent capacitance value.

Figure 3A:
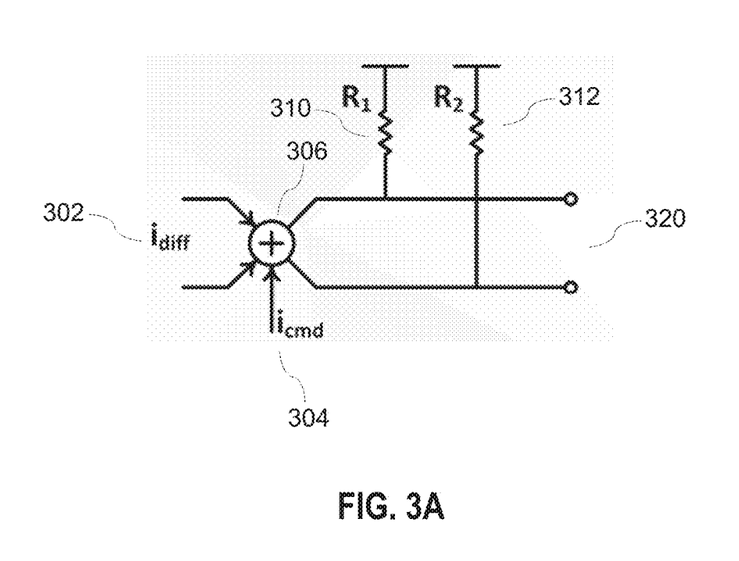
FIG. 3A is a simplified diagram illustrating a summing circuit that combines differential and common mode signals, according to various embodiments of the present disclosure.

FIG. 3A is a simplified diagram illustrating a summing circuit that combines differential and common mode signals according to various embodiments of the present disclosure. Circuit 300 comprises respective differential and common mode current inputs 302 and 304 that may represent the outputs of a nested loop circuit (not shown in FIG. 3A). Circuit 300 further comprises summing element 306, resistive elements 310 and 312 (denoted as R1 and R2), and differential output 320. As person of skill in the art will appreciate, the output of the nested loop and, thus, the inputs to circuit 300 may equally be expressed in terms of input voltages.

In operation, summing element 306 may add differential and common-mode components in inputs 302 and 304 to generate a differential current signal that is then transformed by resistors 310, 312 into differential output voltage 320. As will be apparent to a person of skilled in the art, in certain applications, the magnitude of the biasing current may be restricted, for example, if a bipolar transistor needs to be biased, the base current of the transistor will determine the minimum current in resistors 310, 312. In addition, the maximum resistance value will be defined by the supply voltage and the minimum current for biasing. A restriction on the maximum resistance of resistors 310, 312 limits low frequency cut-off ($f_{LFC}=1/(2*\pi*R*C)$). Stated differently, if the output impedance of circuit 300 is relatively low, the resulting low frequency cut-off of circuit 300 will be relatively high. Therefore, it is desirable to increase the output impedance of circuit 300 such as to decrease its low frequency cut-off.

Figure 3B:
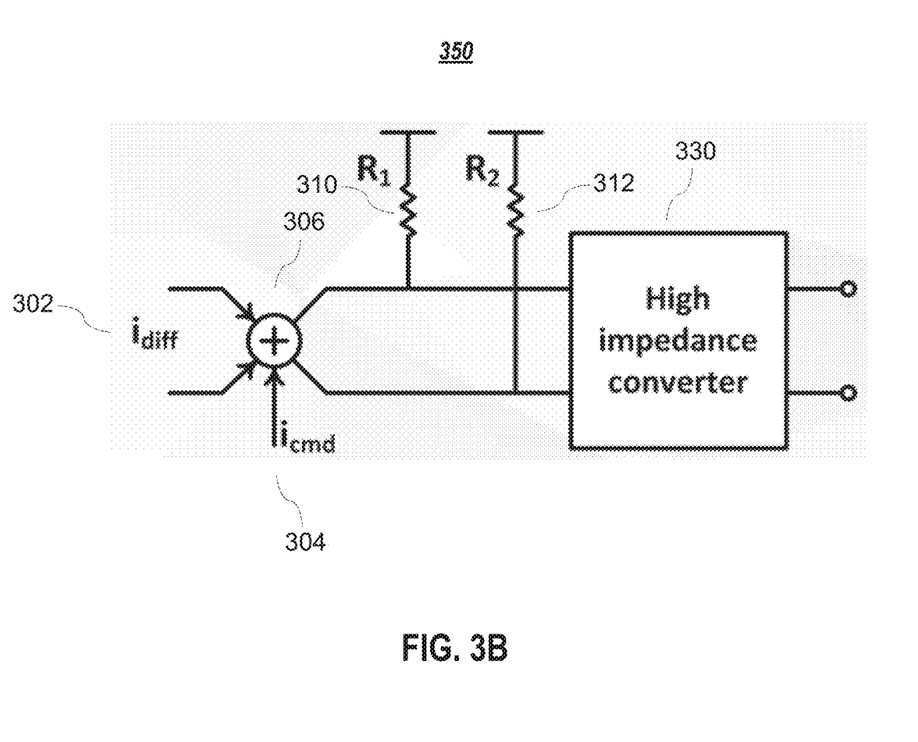
FIG. 3B is a simplified diagram illustrating a circuit comprising a high impedance converter, according to various embodiments of the present disclosure.

FIG. 3B is a simplified diagram illustrating a circuit comprising a high impedance converter, according to various embodiments of the present disclosure. Components similar to those shown in FIG. 3A are labeled in the same manner. Circuit 350 comprises high impedance converter circuit 330, discussed in greater detail below with reference to FIG. 4, that is added to circuit 300 in FIG. 3A. In embodiments, high impedance converter circuit 330 provides sufficient current and voltage biasing, while defining a high impedance that facilitates a suitable low frequency cut-off for various applications.

Figure 4:
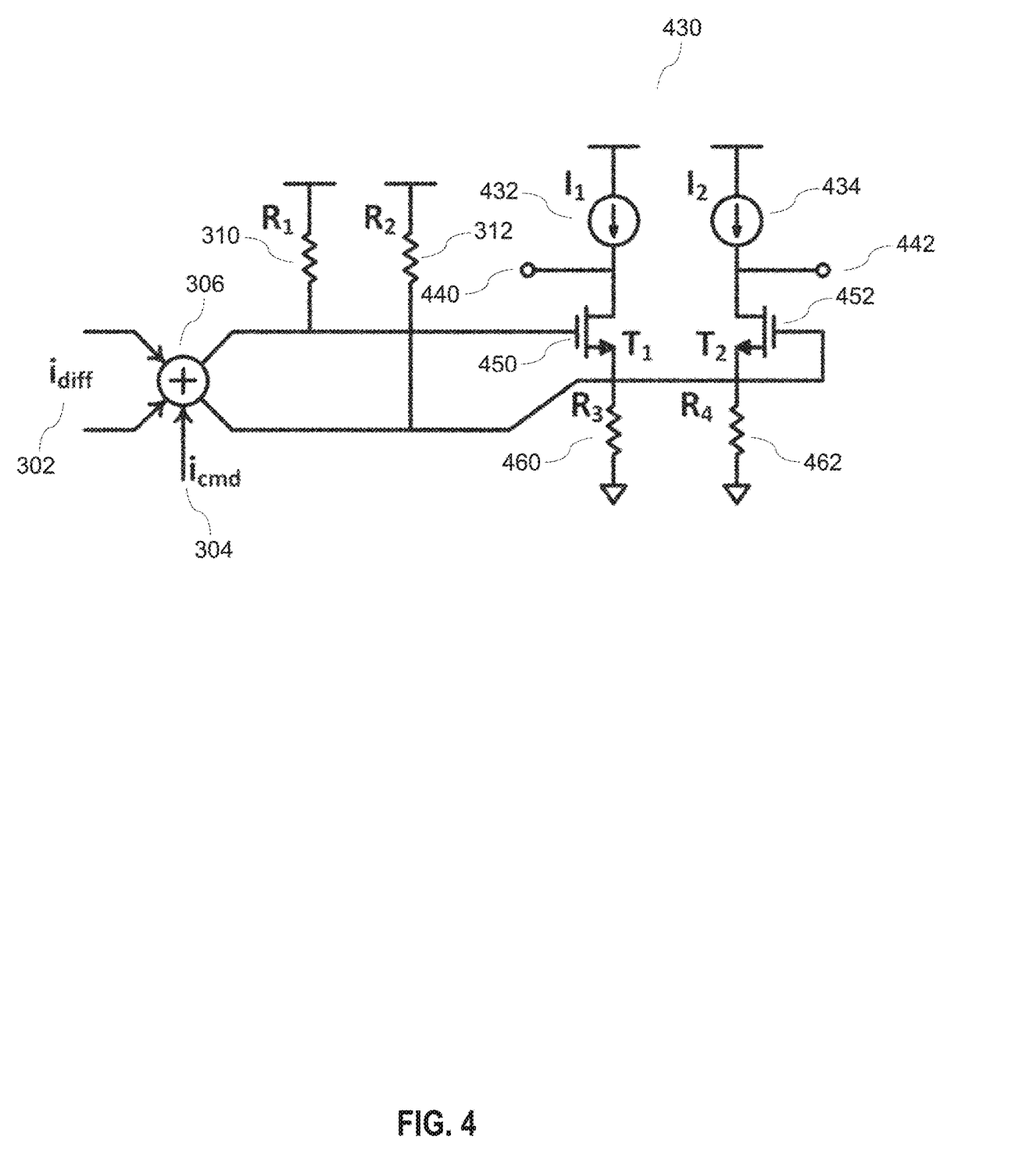
FIG. 4 illustrates an exemplary circuit implementation of the high impedance converter shown in FIG. 3B.

FIG. 4 illustrates an exemplary circuit implementation of the high impedance converter shown in FIG. 3B. High impedance converter 430 comprises current sources 432, 434, and transistors 450, 452 (denoted as T1 and T2). As a person of skill in the art will understand, circuit 400 need not necessarily be implemented with metal oxide semiconductor field-effect transistors (MOSFETs) as any type of transistor design may be used, including bipolar transistors. In operation, transistors 450, 452 may be kept single-ended and biased in saturation. Current sources 432, 434 may provide the biasing currents I1 and I2, respectively, and transistors 450, 452 may absorb the excess currents, e.g., using a limit set by the closed-loop operation of a nested loop circuit (shown in FIG. 5 and FIG. 6). As a result, high impedance converter 430 may achieve a circuit impedance, e.g., in the Mega-Q range and above, thus, allowing amplifier circuits, such as that in FIG. 1, to obtain the sought after low LFC. It is understood that resistors 460, 462 may be used to further increase the overall output impedance of circuit 400.

In embodiments, the output 440, 442 of circuit 400 may produce a current that may be used to bias a subsequent stage (not shown). In embodiments, current sources 432, 434 may be designed to generate a current that accounts for a wide range of possible process and environmental variations. For example, current sources 432, 434 may be designed to produce an excess current that, in operation, may be passed to transistors 450, 452, which may act as current sinks. The voltage at, e.g., output 440 is defined by the difference of the current I1 and the current flowing through transistor 450 multiplied by the impedance of the subsequent stage coupled to output 440. In embodiments, the amount of current that is sinked into transistors 450, 452 may be sensed by a loop that compares (for common mode) the output to a reference signal (e.g., reference signal 624 in FIG. 6) and controls the common mode current (e.g., common mode current 604 in FIG. 6) accordingly.

Figure 5:
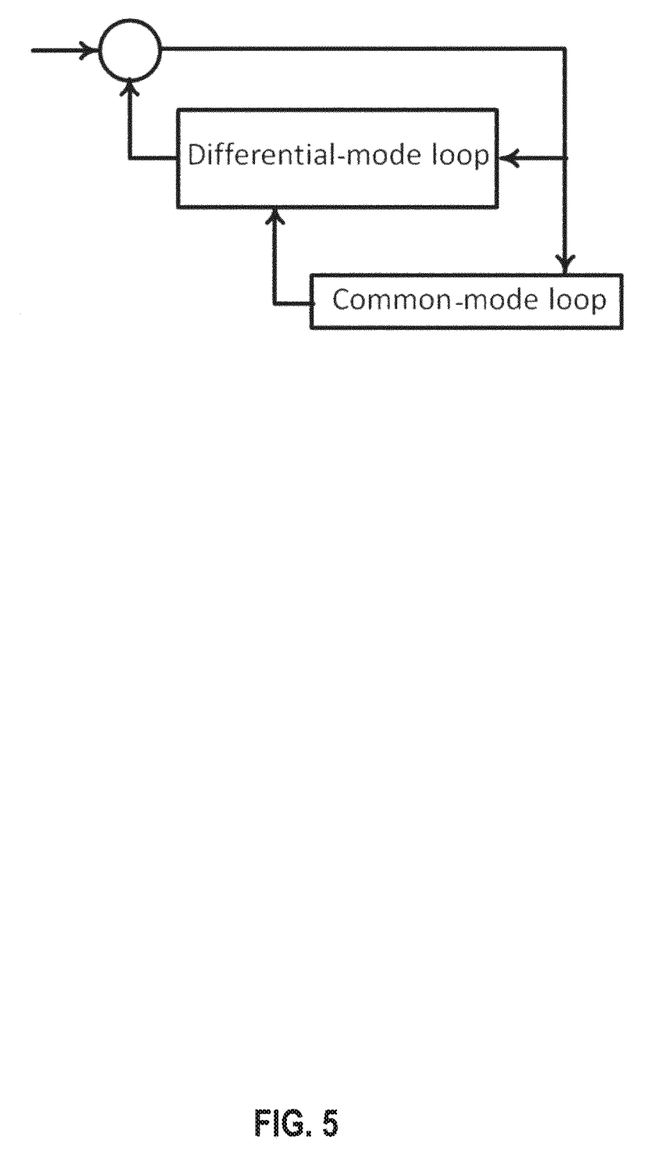
FIG. 5 is a simplified diagram illustrating a nested circuit configuration for processing of differential and common mode signals in a nested loop, according to various embodiments of the present disclosure.

FIG. 5 is a simplified diagram illustrating a nested circuit configuration for processing of differential and common mode signals in a nested loop in which a differential-mode loop and a common-mode loop interact with each other, according to various embodiments of the present disclosure. It is understood that any of the differential-mode loop or common-mode loop may be implemented as a digital or analog loop. It is further understood that any of the differential-mode loop or common-mode loop may be converted to a digital or analog loop and that, in certain embodiments, the differential-mode loop may operate in tandem with the common-mode loop, e.g., in a parallel circuit configuration.

In operation, from a single sensing point, the two nested loops may sense differential and common-mode DC signals. The differential mode loop may correct for offsets that may be present, e.g., in an amplifier stage. Ideally, the differential mode loop is implemented such as to have a maximum operating frequency that is below the LFC. The common-mode loop provides the DC bias point by sensing the common-mode and using a reference for close loop operation. In embodiments, the biasing may be controlled via a closed-loop operation such that advantageously, process, voltage, and temperature variations may be significantly reduced by a suitable design of the two nested loops.

Figure 6:
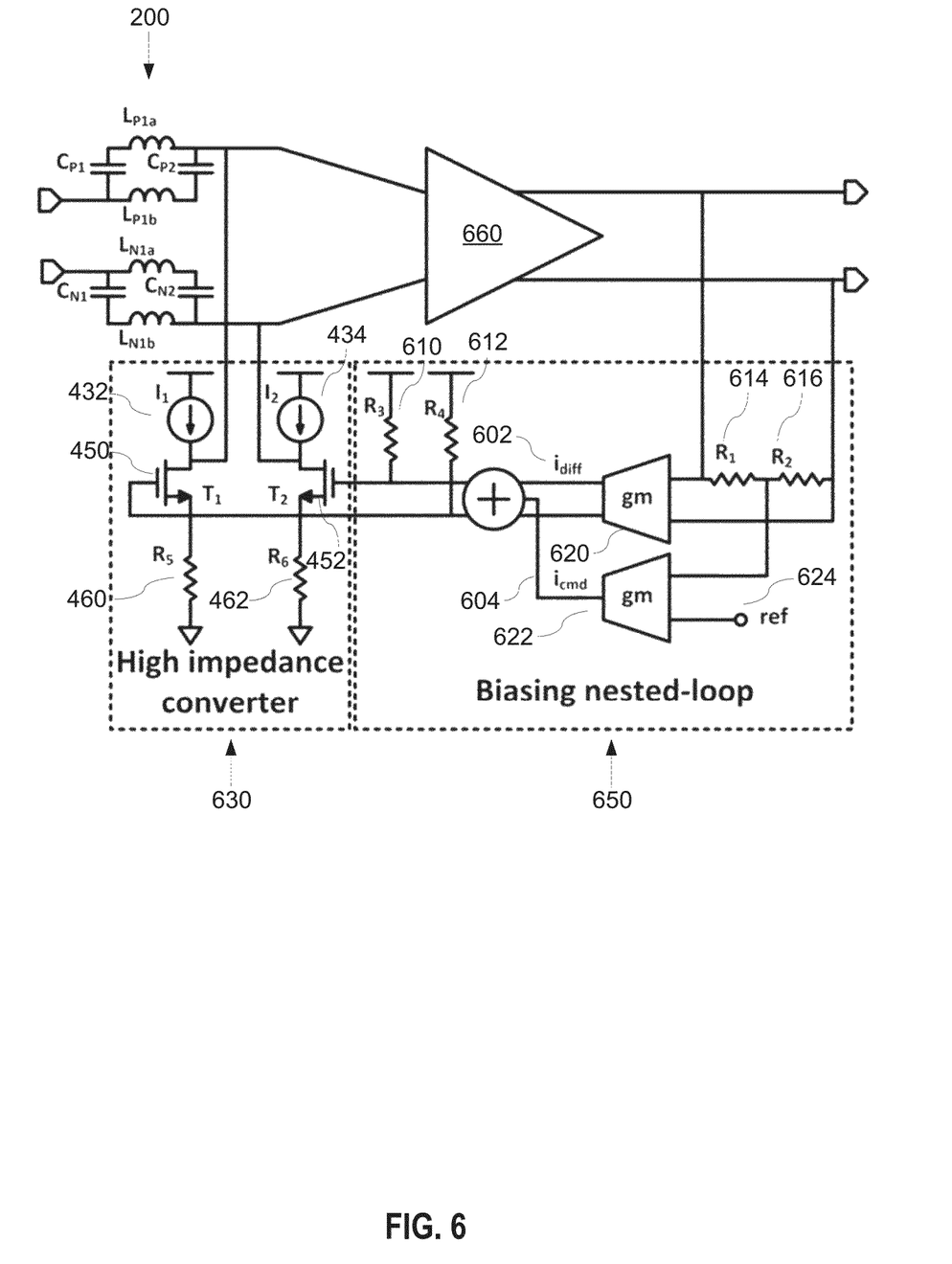
FIG. 6 illustrates an exemplary broadband amplifier circuit, according to various embodiments of the present disclosure.

FIG. 6 illustrates an exemplary broadband amplifier circuit, according to various embodiments of the present disclosure. Circuit 600 comprises amplifier 660, DC blocking capacitor circuit 200, high impedance converter 630, and biasing nested loop circuit 650. Blocking capacitors 200 may be implemented as a distributed capacitor network that is mainly used to reduce parasitic capacitance and improve the higher frequency response of amplifier 660. One skilled in the art will appreciate that capacitors in capacitor circuit 200 may be implemented as banks of parallel capacitors, which may be implemented a variable capacitors.

As previously mentioned, high impedance converter 630 may be used to increase the input impedance to amplifier 660, in particular, when amplifier 660 comprises bipolar transistors. It is understood that any number of components of broadband amplifier circuit 600 may be implemented on-chip. As depicted in FIG. 6, nested loop 650 comprises sensing elements 614, 616 that are implemented as resistors (denoted as R1 and R2). However, this is not intended as limitation on the scope of the present disclosure as other circuit devices, such as MOSFET devices may equally be used.

In embodiments, nested loop 650 may provide differential and common mode biasing to amplifier 660 by using sensing elements 614, 616 to independently detect differential and common-mode signals. Gain stages implemented with transconductance stages 620 and 622 may deliver differential and common-mode outputs 602, 604 used by high impedance converter 630. In embodiments, the differential-mode loop may use transconductance 620 to sense a differential mode signal by using sensing elements 614, 616 that detect a voltage differential at the output of amplifier 660. Similarly, the common-mode loop may comprise transconductance 622 coupled to sensing elements 614, 616 to sense a common mode. In embodiments, transconductances 620, 622 may create signals that are used to control biasing of the amplifier stage.

As person of skill in the art will appreciate, nested loop 650 may output currents and voltages that may be converted into respective voltages and currents. One of skill in the art will further appreciate that sensed currents or voltages may be converted to digital signals, e.g., to enhance processing capabilities or drive high impedance converter 630 with a DAC or similar circuitry. High impedance converter 630 may convert a low impedance of nested loop 650 into a relatively high impedance such that blocking capacitor 200, together with such high impedance, define the low frequency current. Since the low frequency cut-off is defined mainly by the total capacitance at the input of amplifier 660, the input of amplifier 660 may be biased with a certain voltage that, in embodiments, is generated by resistors 610 and 612 that convert currents 602 and 604 into a differential voltage.

It is noted that absent high impedance converter 630, resistors 610 and 612 may be dimensioned in the hundreds of kΩ to facilitate the desired low cut-off frequency, which, may introduce unwanted process variations. Further, relatively high resistance values for resistors 610 and 612 may disadvantageously limit the input current to an amplifier stage that utilizes, e.g., BJT. This, in turn, requires that a limit be put on the value of resistors 610 and 612, e.g., tens of kΩ, which stands in contradiction to the initial design of hundreds of kΩ. Conversely, relatively low resistors 610 and 612 may disadvantageously limit the voltage range that can be achieved, which is mainly determined be the supply voltage and the amount of input current that the amplifier circuit requires. Therefore, to achieve satisfactory performance for amplifier circuits that use, e.g., bipolar junction transistors (BJTs) or components having similar characteristics, in embodiments, high impedance converter 630 may be used to translate the low impedance into a high impedance.

As shown in FIG. 6, high impedance converter 630 may achieve this by using active components. In embodiments, a suitable active circuit may comprise independent transistors 450, 452 that create the desired high impedance as seen by amplifier 660. Transistors 450, 452 may operate, e.g., in a current mode, as voltage-controlled current sources that define the voltage at nodes the input of amplifier 660. Current sources 432, 434, which, by definition, are high impedance devices, may provide the current for the biasing.

It is noted that the implementations illustrated in FIG. 6 are not limited to the constructional detail shown therein or described in the accompanying text. As those skilled in the art will appreciate, different and/or additional components may be used, e.g., a control circuit that may comprise microcontrollers, logic elements, and any other control elements recognized by one of skilled in the art. Other components may comprise coupling capacitors, voltage supplies, impedance matching circuitry, and the like, that may be arranged depending on application. For example, it is understood that both bipolar transistors and CMOS or other technologies may equally be implemented with the scope of the present disclosure.

Figure 7:
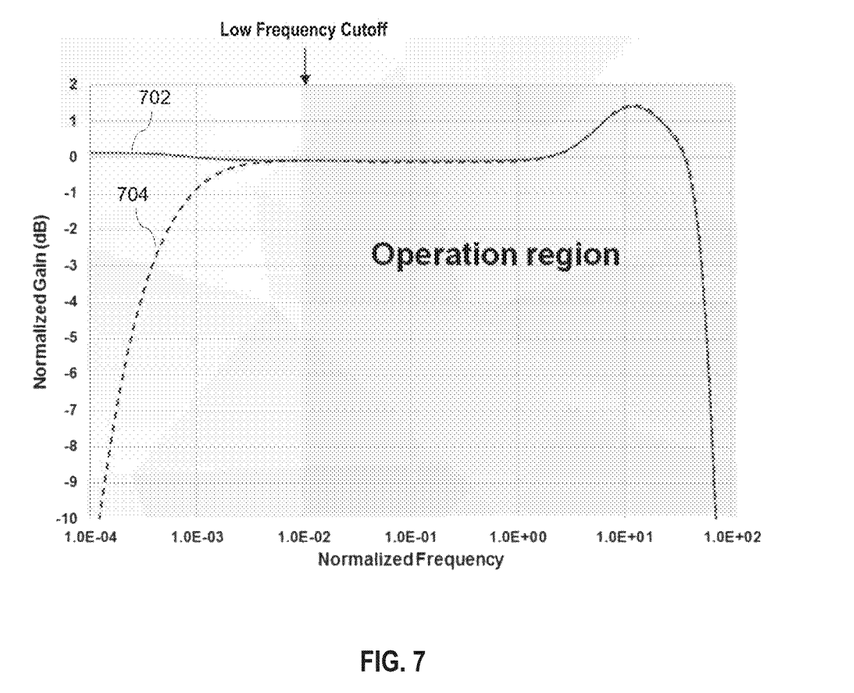
FIG. 7 is a graph that shows plots of normalized frequency responses of an amplifier that utilizes a nested loop, according to various embodiments of the present disclosure.

FIG. 7 illustrates a graph that depicts plots of frequency responses of an exemplary amplifier circuit that utilizes a nested loop, according to various embodiments of the present disclosure. It is noted that experimental data and results herein are provided by way of illustration and were performed under specific conditions using a specific embodiment or embodiments; accordingly, neither these experiments nor their results shall be used to limit the scope of the disclosure of the current patent document.

As depicted the performance of a broadband amplifier is plotted on normalized graph 700. The y-axis represents a normalized gain (in dB), whereas the x-axis is normalized for frequency (in Hz). Solid line 702 in FIG. 7 depicts the frequency response of a circuit that does not utilize a broadband on-chip nested loop AC-coupling circuit. As shown, a DC signal is present such that any DC voltage that is available at the input of the amplifier circuit may adversely affect circuit operation. This is due to the fact that, in effect, no DC blocking is present.

In contrast, dashed line 704 represents the frequency response of a circuit, such as the circuit in FIG. 6, which implements an on-chip DC blocking embodiment according to embodiments of the present disclosure. As shown in FIG. 7, in the low frequency region, the response remains below the low frequency cut-off, while the high frequency response is not significantly affected. As previously mentioned, the low frequency cut-off is defined by the input capacitance and input impedance of the amplifier.

Figure 8:
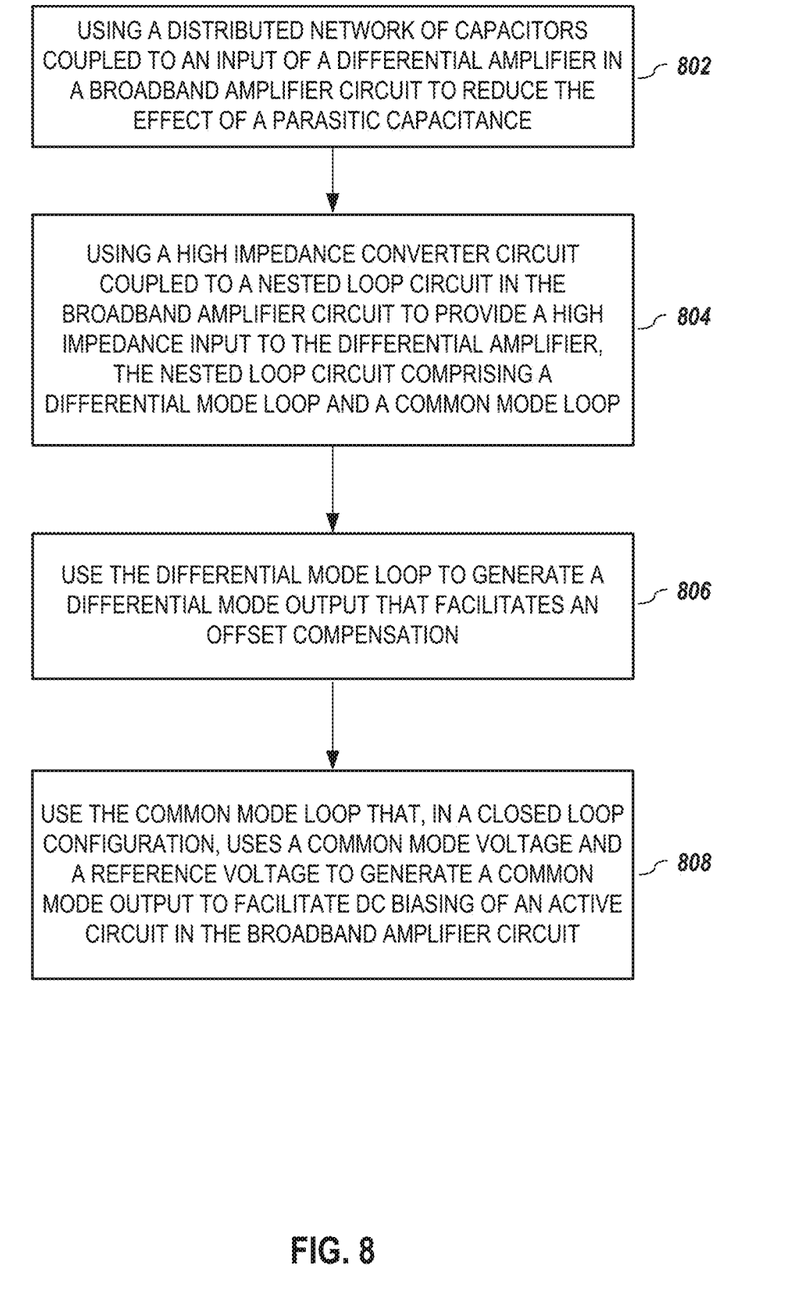
FIG. 8 is a flowchart of an illustrative process for AC-coupling, according to various embodiments of the present disclosure.

FIG. 8 is a flowchart of an illustrative process for AC-coupling, according to various embodiments of the present disclosure. In embodiments, process 800 may begin, at step 802, when a distributed network of capacitors that is coupled to an input of a differential amplifier in a broadband amplifier circuit is used to reduce the effect of a parasitic capacitance.

At step 804, a high impedance converter circuit that is coupled to a nested loop circuit in the broadband amplifier circuit is used to provide a high impedance input to the differential amplifier. In embodiments, the nested loop circuit comprising a differential mode loop and a common mode loop. At step 806, the differential mode loop may be used to generate a differential mode output that facilitates an offset compensation. Finally, at step 808, the common mode loop that, in a closed loop configuration, uses a common mode voltage and a reference voltage to generate a common mode output in order to facilitate DC biasing of an active circuit in the broadband amplifier circuit. One skilled in the art shall recognize that: (1) certain steps may optionally be performed; (2) steps may not be limited to the specific order set forth herein; (3) certain steps may be performed in different orders; and (4) certain steps may be done concurrently.

Aspects of the present invention may be encoded upon one or more non-transitory computer-readable media with instructions for one or more processors or processing units to cause steps to be performed. It shall be noted that the one or more non-transitory computer-readable media shall include volatile and non-volatile memory. It shall be noted that alternative implementations are possible, including a hardware implementation or a software/hardware implementation. Hardware-implemented functions may be realized using application specific integrated circuits (ASICs), programmable arrays, digital signal processing circuitry, or the like. Accordingly, the terms in any claims are intended to cover both software and hardware implementations. Similarly, the term "computer-readable medium or media" as used herein includes software and/or hardware having a program of instructions embodied thereon, or a combination thereof. With these implementation alternatives in mind, it is to be understood that the figures and accompanying description provide the functional information one skilled in the art would require to write program code (i.e., software) and/or to fabricate circuits (i.e., hardware) to perform the processing required.

It shall be noted that embodiments of the present invention may further relate to computer products with a non-transitory, tangible computer-readable medium that have computer code thereon for performing various computer-implemented operations. The media and computer code may be those specially designed and constructed for the purposes of the present invention, or they may be of the kind known or available to those having skill in the relevant arts. Examples of tangible computer-readable media include, but are not limited to: magnetic media such as hard disks; optical media such as CD-ROMs and holographic devices; magneto-optical media; and hardware devices that are specially configured to store or to store and execute program code, such as ASICs, programmable logic devices (PLDs), flash memory devices, and ROM and RAM devices. Examples of computer code include machine code, such as produced by a compiler, and files containing higher level code that are executed by a computer using an interpreter. Embodiments of the present invention may be implemented in whole or in part as machine-executable instructions that may be in program modules that are executed by a processing device. Examples of program modules include libraries, programs, routines, objects, components, and data structures. In distributed computing environments, program modules may be physically located in settings that are local, remote, or both.

One skilled in the art will recognize no computing system or programming language is critical to the practice of the present invention. One skilled in the art will also recognize that a number of the elements described above may be physically and/or functionally separated into sub-modules or combined together.

It will be appreciated to those skilled in the art that the preceding examples and embodiments are exemplary and not limiting to the scope of the present disclosure. It is intended that all permutations, enhancements, equivalents, combinations, and improvements thereto that are apparent to those skilled in the art upon a reading of the specification and a study of the drawings are included within the true spirit and scope of the present disclosure. It shall also be noted that elements of any claims may be arranged differently including having multiple dependencies, configurations, and combinations.

What is claimed is:

1. A nested loop circuit comprising:
a common mode loop that, in a closed loop configuration, uses a common mode voltage and a reference voltage to generate a common mode output that facilitates DC biasing of an active circuit; and
a differential mode loop that generates a differential mode output that facilitates an offset compensation,
wherein the common mode output and the differential mode output are coupled to a high impedance converter circuit that provides a high impedance loading to an input of the active circuit.

2. A nested loop circuit comprising:
a common mode loop that, in a closed loop configuration, uses a common mode voltage and a reference voltage to generate a common mode output that facilitates DC biasing of an active circuit; and
a differential mode loop that generates a differential mode output that facilitates an offset compensation,
wherein the differential mode loop is nested in the common mode loop.

3. A broadband amplifier circuit comprising:
a differential amplifier;
nested loop circuit coupled to the differential amplifier, the nested loop circuit comprising:
a common mode loop that, in a closed loop configuration, uses a common mode voltage and a reference voltage to generate a common mode output that facilitates DC biasing of an active circuit; and
a differential mode loop that generates a differential mode output that facilitates an offset compensation; and
a high impedance converter circuit coupled to the nested loop circuit, the high impedance converter circuit provides a high impedance input to the differential amplifier.

4. The broadband amplifier circuit of claim 3, wherein the differential amplifier is coupled to a distributed network of input capacitors.

5. The broadband amplifier circuit of claim 3, wherein the high impedance converter circuit comprises a voltage controlled current source that is coupled in a single-ended circuit configuration.

6. The broadband amplifier circuit of claim 3, wherein the common mode loop is nested in the differential mode loop.

7. The broadband amplifier circuit of claim 3, wherein the differential mode loop is nested in the common mode loop.

8. The broadband amplifier circuit of claim 3, wherein the differential amplifier is coupled to Mach-Zehnder modulator.

9. The broadband amplifier circuit of claim 3, wherein the differential amplifier is driven by a digital-to-analog-converter.

10. An AC-coupling method comprising:
using a nested loop circuit to generate a differential mode output, which facilitates an offset compensation and a common mode output that facilitates DC biasing of an active circuit, the nested loop circuit being coupled to a differential amplifier and comprising:
  a common mode loop that, in a closed loop configuration, uses a common mode voltage and a reference voltage to generate the common mode output; and
  a differential mode loop that generates the differential mode output.

11. The AC-coupling method of claim 10, further comprising a high impedance converter circuit coupled to the nested loop circuit, the high impedance converter circuit provides a high impedance loading to an input of the active circuit.

12. The AC-coupling method of claim 11, wherein the differential amplifier is coupled to a distributed network of input capacitors to reduce an effect of a parasitic capacitance.

13. The AC-coupling method of claim 12, wherein the distributed network of input capacitors is implemented as an integrated DC blocking capacitor circuit.

14. The AC-coupling method of claim 12, wherein the distributed network of input capacitors is implemented on a chip and defines a low cut-off frequency.

15. The AC-coupling method of claim 14, wherein the chip comprises a set of inductors that are disposed in close physical proximity to each other on an upper metal layer of the chip to reduce a stray capacitance.

16. The AC-coupling method of claim 15, wherein one or more of the set of inductors are disposed between two capacitors in the distributed network of input capacitors.

* * * * *